United States Patent [19]

Holzapfel et al.

[11] Patent Number: 4,839,710
[45] Date of Patent: Jun. 13, 1989

[54] CMOS CELL WHICH CAN BE USED AS A RESISTOR, A CAPACITOR, AN RC COMPONENT OR A TERMINATING IMPEDANCE OF A SIGNAL

[75] Inventors: Heinz P. Holzapfel, Munich; Peter Michel, Grafing, both of Fed. Rep. of Germany

[73] Assignee: Siemens Aktiengesellschaft, Berlin and Munich, Fed. Rep. of Germany

[21] Appl. No.: 203,532

[22] Filed: Jun. 8, 1988

Related U.S. Application Data

[63] Continuation of Ser. No. 855,353, Apr. 24, 1986, abandoned.

[30] Foreign Application Priority Data

Apr. 24, 1985 [DE] Fed. Rep. of Germany ....... 3514849

[51] Int. Cl.$^4$ .............. H01L 27/10; H01L 27/02; H01L 29/78
[52] U.S. Cl. .................. 357/45; 357/20; 357/23.1; 357/41; 357/42; 357/51; 357/88
[58] Field of Search ............ 357/42, 45, 51, 23.1, 357/20, 41, 88

[56] References Cited

U.S. PATENT DOCUMENTS

| | | | |
|---|---|---|---|
| 4,399,417 | 8/1983 | Ballantyne et al. | 357/51 |
| 4,668,972 | 5/1987 | Sato et al. | 357/45 |

FOREIGN PATENT DOCUMENTS

| | | | |
|---|---|---|---|
| 0136952 | 4/1985 | European Pat. Off. | |
| 58-7854 | 1/1983 | Japan | 357/42 |
| 59-135745 | 8/1984 | Japan | 357/42 |

OTHER PUBLICATIONS

VLSI Design of Feb. 1984, pp. 78–80, "Understanding CMOS Gate-Array Cell Designs", Gagliardi.

*Primary Examiner*—Andrew J. James
*Assistant Examiner*—Ngan Van Ngo
*Attorney, Agent, or Firm*—Hill, Van Santen, Steadman & Simpson

[57] ABSTRACT

A CMOS technology cell which can be formed as a resistor, a capacitor, a resistor capacitor combination or a load impedance in a gate array wherein a basic cell is replaced by a special cell which has the same geometrical dimensions as the special cell. The special cell contains a pair of transistors (Tr1 and Tr2) with channels KP, KN of the transistors which are narrow but have long lengths. The transistors are arranged laterally to the source and drain of the transistors and due to the long channel length of each transistors, the transistors can be used as a resistor having a substantial resistance value. Also, the gate capacitance can be used as a high value capacitor thus allowing the special cells to provide resistance, capacitance, RC or load impedance for the other cells.

7 Claims, 10 Drawing Sheets

4,839,710

CMOS CELL WHICH CAN BE USED AS A RESISTOR, A CAPACITOR, AN RC COMPONENT OR A TERMINATING IMPEDANCE OF A SIGNAL

This is a continuation of application Ser. No. 855,353, filed Apr. 24, 1986, abandoned.

BACKGROUND OF THE INVENTION

1. Field of the Invention

This invention relates in general to a cell constructed in CMOS technology for forming at least one resistor and/or at least one capacitor wherein at least one p-channel transistor and at least one n-channel transistor are provided which can be particularly used in a gate array.

2. Description of the Prior Art

For the rapid construction of customer specified modules, it is known to use modules constructed from premanufactured or predeveloped cells in which the individual cells are connected to each other according to the customers requirements. One possibility consists in the use of so-called gate arrays in which pairs of transistors constructed in CMOS technology are arranged in the form of a matrix on a module. Gate arrays of this kind are described, for example, in "Elektronik" Volume 19 of Oct. 21, 1984, Page 68 or in "VLSI-Design" of February 1984, Pages 78 through 80.

It is sometimes desirable from the circuit standpoint in known CMOS gate arrays to provide surface space saving resistors. However, none of the prior art provides such resistors in the region of the cells. Resistors are used, for example, in fixing determinant levels on signal lines, in store write and read lines and in the wiring of delay components. It also would be desirable to have available capacitors of a surface space saving design for the construction of dynamic storage cells and delay components. It should be borne in mind that the active zones on a CMOS gate array have a predetermined structure. Only the non-customs specific gates and diffusion zones of the basic cells can be used for the capacitors and the resistors. Particularly, for high ohmic resistors and high value capacitors which are large as compared to a typical gate capacitor, it is necessary to use a relatively large number of the basic cells of the gate array to obtain the desirable values.

The construction of resistors and capacitors using the diffusion zones and gates already available on the gate array has the disadvantage that a relatively large percentage of the basic cells must be used for this purpose.

SUMMARY OF THE INVENTION

It is an object of the present invention to provide a special cell for the construction of resistors and/or capacitors which can be provided in place of the basic cells in the gate array without necessitating a modification of the geommetric dimensions in the gate array.

It is an object of the present invention to provide a cell constructed in CMOS technology wherein at least one p-channel transistor and at least one n-channel transistor are provided for use in a gate array and that the channel of each transistor is designed so that it is narrow and has a long length. It is another object of the present invention to provide a cell constructed in CMOS technology that can be formed as a resistor. Another object is to form a cell which can be used as a capacitor. Yet another object of the invention is to provide a cell which can be used as an RC circuit and yet an additional object is to provide a cell which can be used as a terminating impedance for a signal line.

The advantages of the present invention consists in that cells according to the invention can be arranged in the gate array in place of the basic cells without interrupting the periodicity of the gate array. The cell according to the invention can be provided at each location of a basic cell. If the cell is arranged at the sides of the basic cell strips, this does not impair the placement program.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
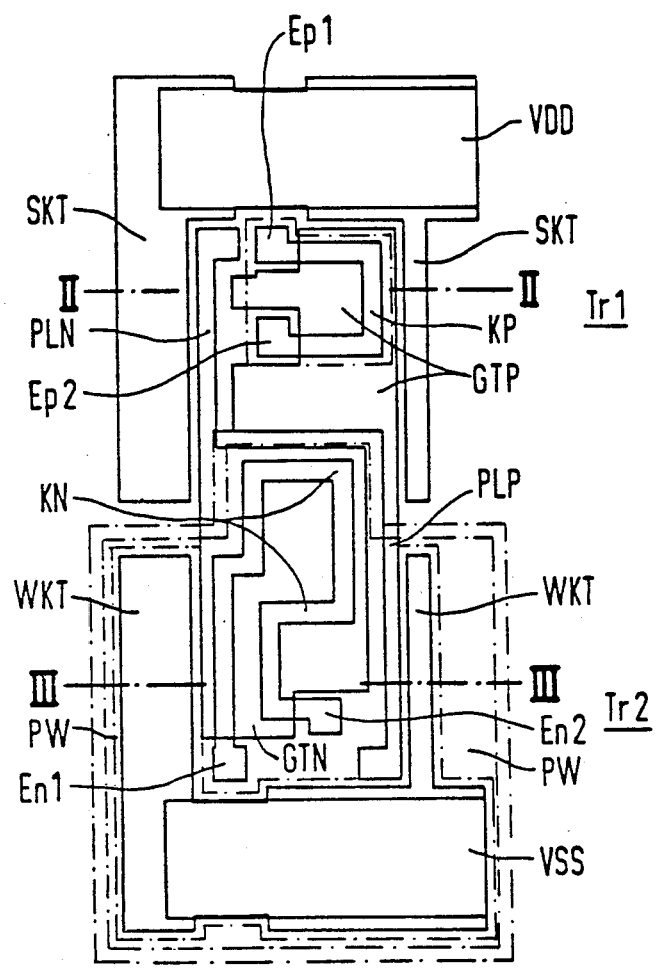
FIG. 1 is a plan view of the cell according to the invention.
Figure 4:
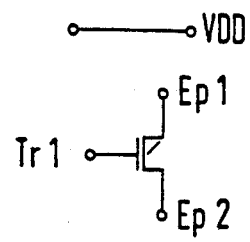
FIG. 4 is the equivalent circuit diagram of the cell illustrated in FIG. 1.
Figure 4:
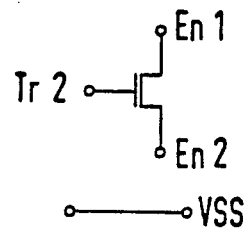

FIG. 1 is a plan view illustrating the layout of the cell. The upper portion of the cell comprises a first transistor Tr1 and the lower portion comprises a second transistor Tr2. FIG. 4 is an electrical schematic view of the cell of FIG. 1 and shows the two transistors Tr1 and Tr2 where transistor Tr1 is a p-channel transistor and transistor Tr2 is a n-channel transistor. The drain of transistor Tr1 is designated Ep1 and the source is designated Ep2. The drain of transistor Tr2 is designated En1 and the source is designated En2.

Figure 2:
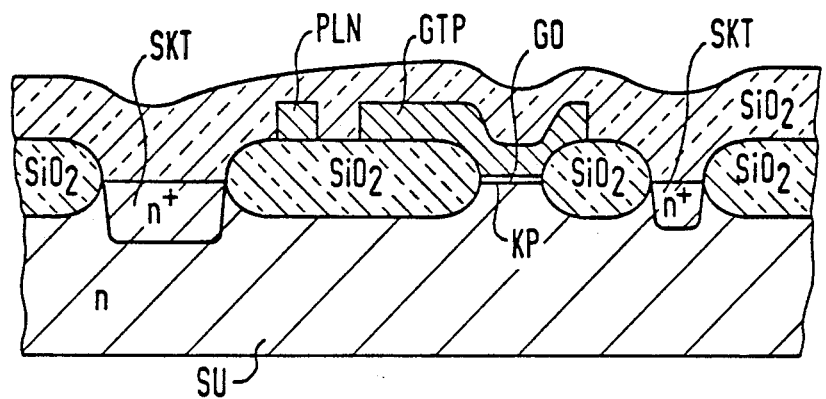
FIG. 2 is a sectional view taken on line II—II.
Figure 3:
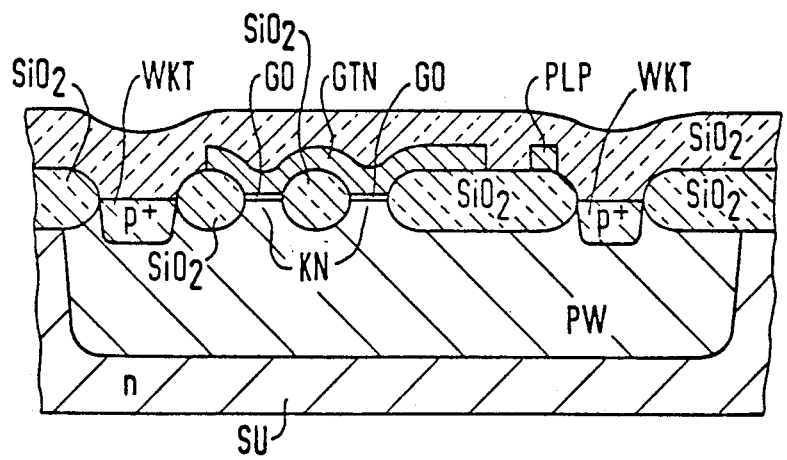
FIG. 3 is a sectional view taken on line III—III from FIG. 1.

FIGS. 2 and 3 are respectively sectional views taken on lines II—II and III—III through the layout of the cell illustrated in FIG. 1. The transistor Tr1 arranged in the upper part of the layout illustrated in FIG. 1 has the drain Ep1 and the source Ep2 as illustrated and it can be seen that the channel KP of transistor Tr1 is arranged laterally to the drain Ep1 and the source Ep2. The gate GTP is located above the channel KP and is connected to a connection line PLP which is formed of polysilicon and which is arranged adjacent the second transistor Tr2. This allows the transistor Tr1 and the gate to be connected to an operating voltage VSS as illustrated.

FIG. 2 is a more detail sectional view of the transistor Tr1. There is provided in a n substrate SU various zones starting from the left comprising a field oxide zone $SiO_2$ and then there is arranged a n+ zone SKT which forms the n+ substrate contact. Then a field oxide zone $SiO_2$ and then the channel KP after which a field oxide zone $SiO_2$ is arranged. Then a n+ zone SKT (n+ substrate) and then a field oxide zone $SiO_2$. The gate oxide GO is arranged above the channel KP and the gate GTP is arranged over the gate oxide GO. Arranged adjacent to the gate GTP is the connection line PLN which connects to the gate of the transistor Tr2.

The method of forming the individual zones of the transistor Tr1 is known per se in the prior art and therefore is not described in detail herein.

The transistor Tr2 is constructed similar to transistor Tr1 except that the transistor Tr2 is arranged in a P-trough PW formed in the substrate SU. This makes it possible to construct a n-channel transistor. As is illustrated in FIG. 3, commencing from the left side of the FIG. 3 there is first a field oxide $SiO_2$ and then a p+ zone which serves as a trough contact. Then there is a field oxide zone $SiO_2$ after which the channel KN is arranged and then a field oxide layer $SiO_2$ Then there is a p+ zone which forms a trough contact and then another field oxide zone $SiO_2$ Since the channel of the transistor Tr2 is positioned differently than the channel of the transistor Tr1 as shown in the sectional view of FIG. 3, the channel KN is interrupted by a field oxide zone $SiO_2$ as illustrated. The gate oxide GO is arranged above the channel KN and the gate GTN is arranged above the gate oxide GO. The connection line for the gate of the transistor Tr2 is arranged adjacent to the gate GTN and is indicated PLP. In transistor Tr2 the channel KN is basically arranged laterally to the source and drain electrodes En1 and En2.

In this specification, arranged laterally means that the channel rather than extending on a straight line between the source and drain extends for a distance which is substantially greater than the straight line between the source and drain. For example, as shown in FIG. 1, the channel KP is formed of three portions. Two portions are horizontal and one is vertical in FIG. 1. The channel KN in FIG. 1 is even longer in that it has four vertical portions and four horizontal portions.

Two operating voltages VDD and VSS are connected adjacent to the cell and can be connected to the gate or to the drain or source so as to form resistors or capacitors as disclosed in the present invention.

Figure 5:
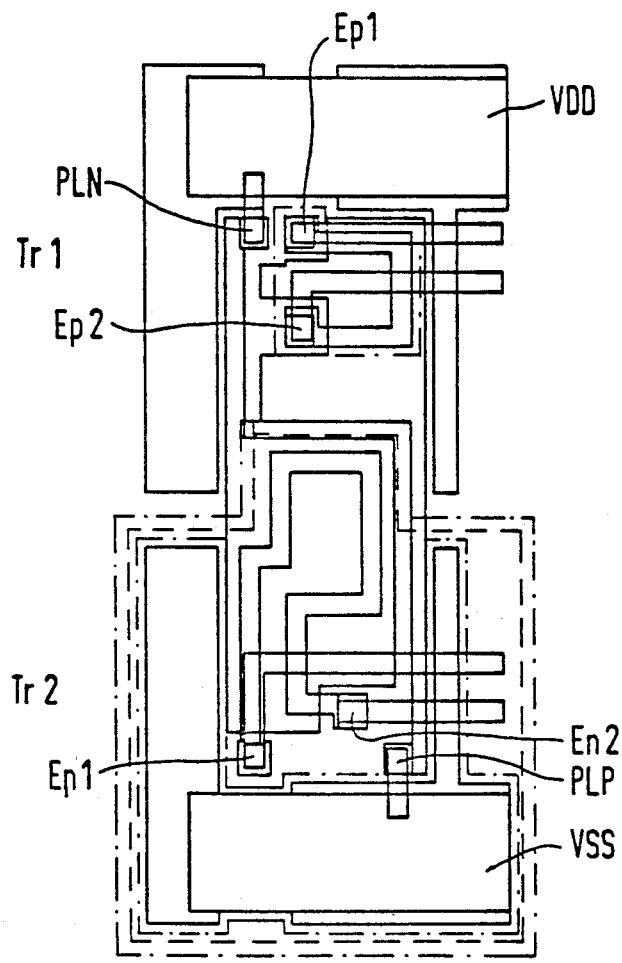
FIG. 5 is a plan view of the cell when used as a resistor.
Figure 6:
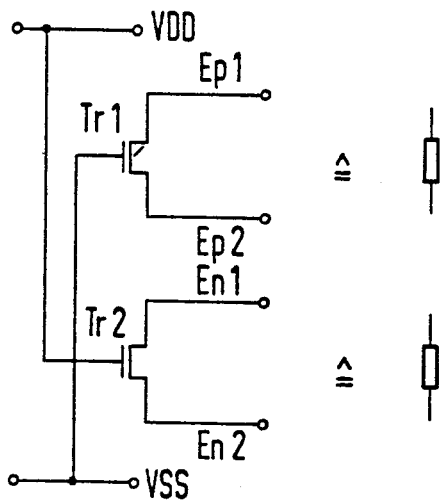
FIG. 6 illustrates the equivalent circuit of a resistor formed from the cell illustrated in FIG. 5.

FIG. 5 illustrates how a cell can be used to construct a resistance element and the corresponding equivalent circuit diagram is shown in FIG. 6. The gate terminal PLP of the transistor Tr1 is connected to the operating voltage VSS. The gate terminal PLN of transistor Tr2 is connected to the operating voltage VDD. In FIG. 6, two resistors are formed and the drain and source terminals Ep1 and Ep2 form one pair of terminals for the first resistor and the source and drain terminals En1 and En2 for the pair of terminals for the second resistor. By appropriately dimensioning the channels KP and KN, the resistors can be formed which have an impedance of 500k ohms. For this purpose, the channels Kn and Kp are very narrow but are very long. This is illustrated in FIG. 1.

Figure 7:
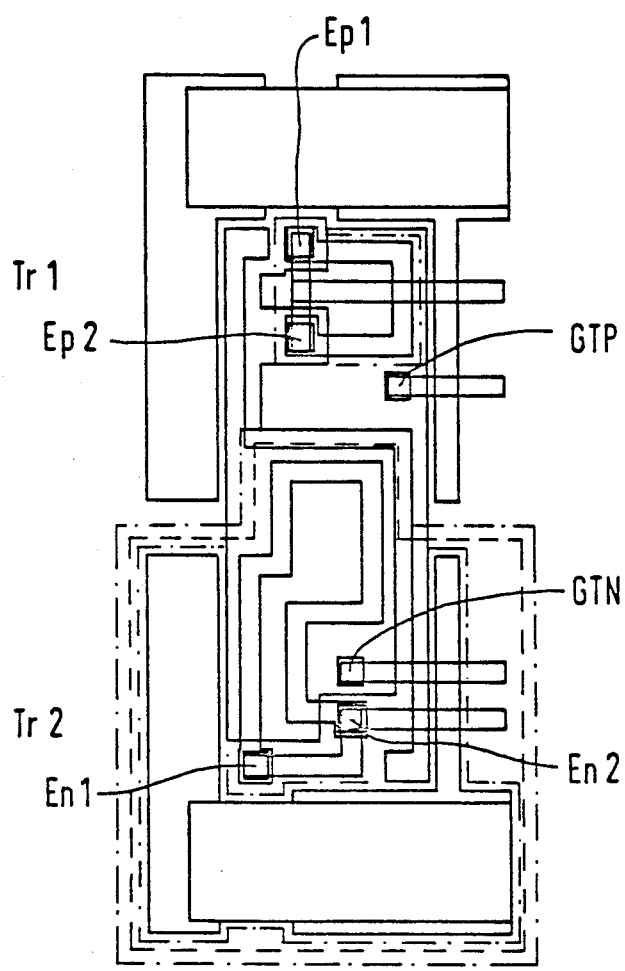
FIG. 7 is a plan view of the cell when it is used as a capacitor.
Figure 8:
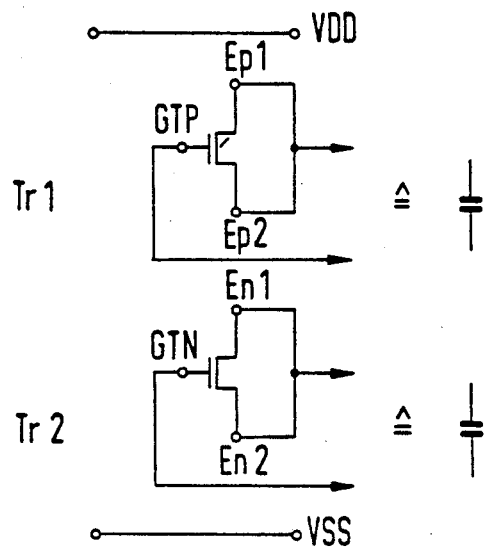
FIG. 8 is the equivalent circuit diagram of the cell shown in FIG. 7.

So as to construct a capacitor from the cell reference may be made to FIG. 7 and the corresponding equivalent circuit of FIG. 8. In this embodiment, the drain Ep1 and the source Ep2 of transistor Tr1 are connected together and the drain En1 and the source En2 of the transistor Tr2 are connected together and these common connections form the first connection for the capacitors which are to be formed. The second terminal of each of the capacitors is in each case formed by the gate GTP of the transistor Tr1 and the gate GTN of the transistor Tr2. The cell can be used to produce, for example, capacitors having capacitance of 150 to 420 femto farads.

Figure 10:
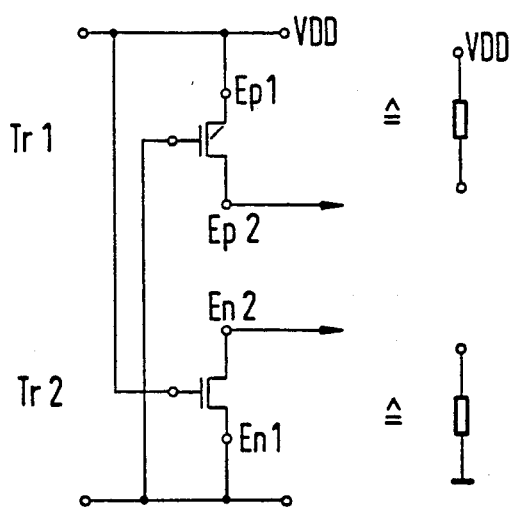
FIG. 10 is the equivalent circuit diagram of the cell illustrated in FIG. 9.
Figure 9:
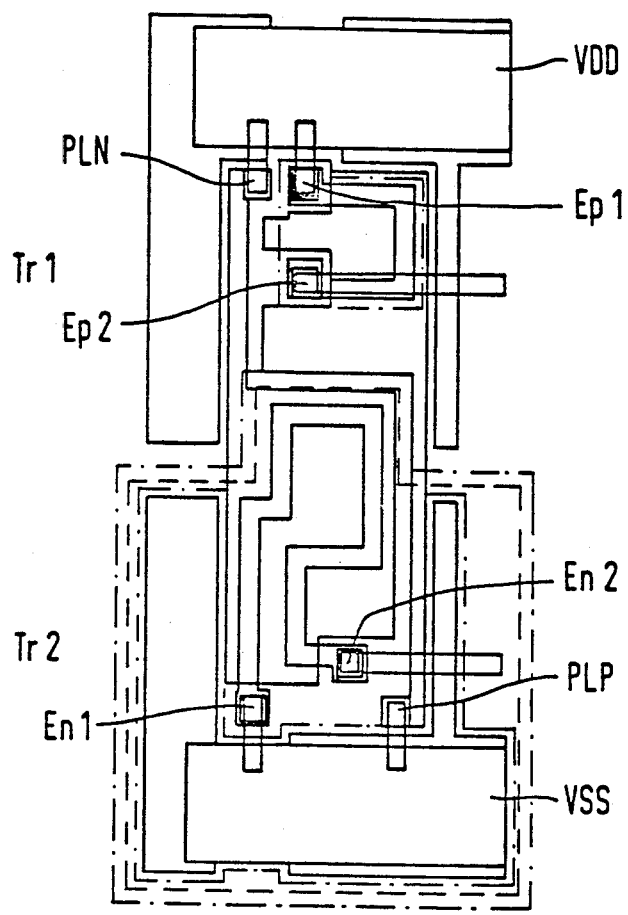
FIG. 9 is a plan view of the cell when it is used as the terminating impedance of a signal line.

FIG. 9 illustrates the use of the cell as a terminating impedance for signal lines and FIG. 10 is the equivalent circuit diagram. In this embodiment, the gate of the transistor Tr1 is connected to the operating voltage VSS and the gate of transistor Tr2 is connected to the operating voltage VDD. The source Ep1 of the transistor Tr1 is connected to operating voltage VDD and the drain Ep2 is supplied to a consumer. In transistor Tr2, the gate is connected to the voltage VDD and the source En2 is connected to a consumer and the drain En1 is connected to the voltage VSS.

Figure 11:
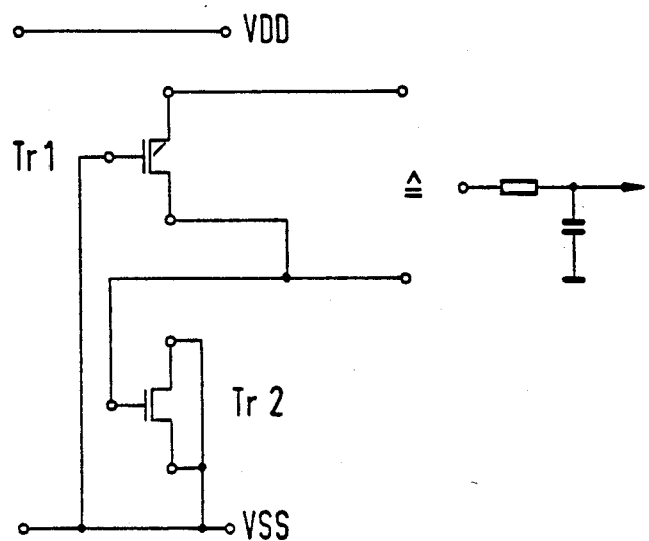
FIG. 11 is the equivalent circuit diagram of the cell when used as an RC component.

FIG. 11 is an electrical schematic which illustrates how the cell can be connected to form an RC component. For this purpose, the transistor Tr1 is connected as a resistor as illustrated 6 for example and the transistor Tr2 is connected as a capacitor as illustrated in FIG. 8 for example. Thus, the combination of the transistors Tr1 and Tr2 as illustrated in FIG. 11 form a series resistor and a parallel capacitor as shown.

Figure 13:
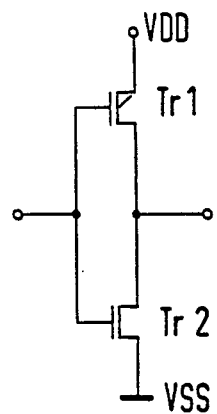
FIG. 13 is the equivalent circuit diagram of the cell shown in FIG. 12.
Figure 12:
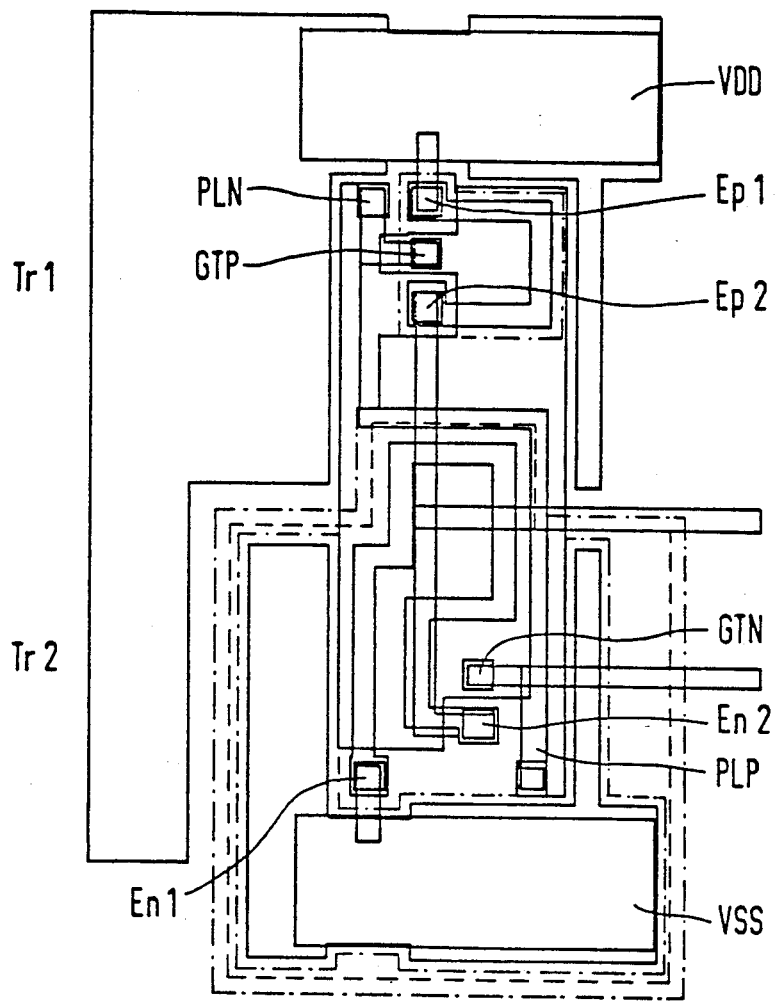
FIG. 12 is a plan view of the cell when used as an inverter.

FIG. 12 illustrates how the cell can be used to construct an inverter which can be used as a switching element. Since the channel length is long, and the channel width is narrow, a long switching time can be obtained. The connection of the transistors Tr1 and Tr2 are illustrated in FIG. 13 wherein the transistors Tr1 and Tr2 are connected in series between the voltages VDD and VSS. The gates of the two transistors are connected together as shown and the common terminals between the transistors provided with an output terminal as illustrated.

Figure 14:
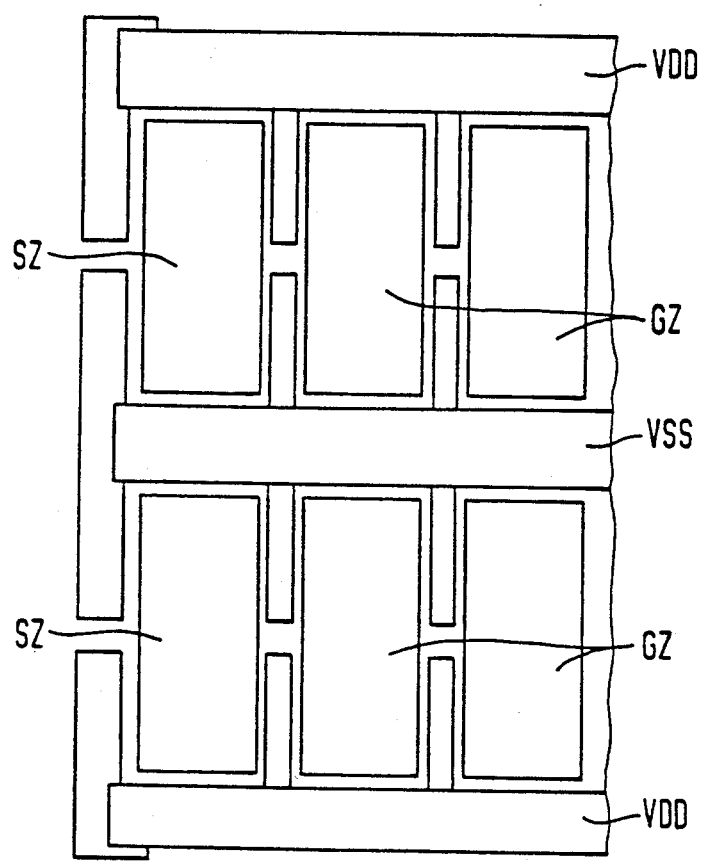
FIG. 14 illustrates the arrangement of a cell in a gate array.

FIG. 14 represents a layout of a gate array and shows the cells arranged in a matrix formation. At each point of the matrix there can be arranged either a basic cell GZ which corresponds to the prior art devices or a cell SZ according to the present invention. It is expedient, however, to arrange the cells SZ according to the invention at the edge of the gate array since this avoids imperiment of the separation program.

The cell according to the invention contains two transistors Tr1 and Tr2. However, it is also possible to modify the number of transistors. It is additionally possible to change the resistance and capacitance values by changing the channel width and the channel length.

Although the invention has been described with respect to preferred embodiments, it is not to be so limited as changes and modifications can be made which are within the full intended scope of the invention as defined by the appended claims.

We claim as our invention:

1. A cell constructed in CMOS-technology, wherein at least one p-channel transistor and at least one n-channel transistor are provided each with a source, a drain and a gate electrode in particular for use in a gate array, wherein the channel (KP, KN) of each of said transistor (Tr1, Tr2) is constructed so that the length of the channel is in the direction of current flow and the width of the channel is in the direction transverse to current flow wherein each of said transistors (Tr1, Tr2) is designed so that the source and drain (Ep1, Ep2 and En1, En2) are positioned adjacent to each other and wherein the length of the channel (KP and KN) does not extend in a straight line between said source and drain, but is substantially longer than a straight line between said source and drain and the width of said channel is short.

2. A cell as claimed in claim 1 wherein a resistor is formed and the gate terminal (GTP and GTN) of each of said transistors (Tr1, Tr2) is connected to an operating voltage (VSS, VDD) and said drain and source terminals (Ep and En) form the terminals for said resistor.

3. A cell as claimed in claim 1 wherein a capacitor is formed and the drain and source terminals (Ep, En) of each of the transistors (Tr1, Tr2) are connected to each other and form the first terminal of the capacitor, and the gate terminal (GTP, GTN) forms the other terminal of the capacitor.

4. A cell as claimed in claim 1, wherein a switching element is formed and the transistors (Tr1, Tr2) are connected as an inverter.

5. A cell according to claim 1 wherein the cell has the same geometric dimensions as the basic cell of the gate array.

6. A cell according to claim 1 wherein the cell is arranged at the sides of the basic cell of the gate array.

7. A cell as claim in claim 1 wherein a terminating impedance for a signal line is formed, first and second operating voltages, the source of said p-channel transistor and the gate of said n-channel transistor connected to said first operating voltage and the source of said n-channel transistor and the gate of said p-channel transistor connected to said second operating voltage.

* * * * *